(12) United States Patent
Luning et al.

(10) Patent No.: US 6,351,013 B1
(45) Date of Patent: Feb. 26, 2002

(54) LOW-K SUB SPACER POCKET FORMATION FOR GATE CAPACITANCE REDUCTION

(75) Inventors: Scott Luning, San Francisco; David Wu; Khanh Tran, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/352,339

(22) Filed: Jul. 13, 1999

(51) Int. Cl.[7] .................. H01L 31/062; H01L 31/113; H01L 27/088; H01L 21/3205
(52) U.S. Cl. ............... 257/368; 257/372; 257/900; 257/369; 438/595
(58) Field of Search ................... 257/372, 368, 257/369, 717, 900, 69, 204, 305; 438/184, 230, 265, 303, 595

(56) References Cited

U.S. PATENT DOCUMENTS

| | | | |
|---|---|---|---|
| 5,200,352 A | * 4/1993 | Pfiester | 437/44 |
| 5,319,232 A | * 6/1994 | Pfiester | 257/344 |
| 5,334,870 A | * 8/1994 | Katada et al. | 257/371 |
| 5,670,804 A | * 9/1997 | Usagawa et al. | 257/279 |
| 5,672,544 A | * 9/1997 | Pan | 437/200 |
| 5,747,373 A | * 5/1998 | Yu | 438/305 |
| 5,811,342 A | * 9/1998 | Wu | 438/303 |
| 5,880,018 A | * 3/1999 | Boeck et al. | 438/619 |
| 5,977,600 A | * 11/1999 | Wristers et al. | 257/408 |
| 5,998,849 A | * 12/1999 | Ishimaru et al. | 257/410 |

* cited by examiner

*Primary Examiner*—Olik Chaudhuri
*Assistant Examiner*—Shrinivas H. Rao

(57) ABSTRACT

The capacitance between the gate electrode and the source/drain regions of a semiconductor device is reduced by forming sub-spacers of a low dielectric constant (K) material at the corners of the gate electrode above the source/drain regions. Subsequently, insulating sidewall spacers are formed over the sub-spacers to shield-shallow source/drain regions from subsequent impurity implantations. The resulting semiconductor device exhibits reduced capacitance between the gate electrode and the source/drain regions, while maintaining circuit reliability.

6 Claims, 3 Drawing Sheets

US 6,351,013 B1

LOW-K SUB SPACER POCKET FORMATION FOR GATE CAPACITANCE REDUCTION

TECHNICAL FIELD

The present invention relates to a semiconductor device and a method of manufacturing a semiconductor device with reduced capacitance between the gate electrode and the source/drain regions. The present invention is particularly applicable in manufacturing high density CMOS semiconductor devices with design features of 0.25 microns and under.

BACKGROUND ART

The escalating requirements for high densification and performance associated with ultra large scale integration semiconductor devices require design features of 0.25 microns and under, increased transistor and circuit speeds, high reliability and increased manufacturing throughput. The reduction of design features to 0.25 microns and under challenges the limitations of conventional semiconductor methodology.

Conventional semiconductor devices typically comprise a semiconductor substrate, normally doped monocrystalline silicon, and a plurality of interleaved dielectric and conductive layers formed thereon. In a conventional semiconductor device 100 illustrated in FIG. 1, p-type substrate 1 is provided with field oxide 2 for isolating an active region comprising N+ source/drain regions 3, and a gate electrode 4, typically of doped polysilicon, above the semiconductor substrate with gate oxide 5 therebetween. Interlayer dielectric layer 6, typically silicon dioxide, is then deposited thereover and openings formed by conventional photolithographic and etching techniques. The openings are filled with conductive material to establish electrical contact between subsequently deposited conductive layer 8, typically aluminum or an aluminum-base alloy, and source/drain regions 3 through contacts 7, and to transistor gate electrode 4. Dielectric layer 9, typically silicon dioxide, is deposited on conductive layer 8, and another conductive layer 10, typically aluminum or an aluminum-base alloy, formed on dielectric layer 9 and electrically connected to conductive layer 8 through vias 11.

With continued reference to FIG. 1, conductive layer 10 is the uppermost conductive layer and, hence, constitutes the wire bonding layer. Dielectric layer 12, also typically silicon dioxide, is deposited, and a protective dielectric scratch resistant topside layer 13 deposited thereon. Protective dielectric layer 13 typically comprises a nitride layer, such as silicon nitride ($Si_3N_4$). Alternatively, protective dielectric layer 13 may comprise a dual topcoat comprising a nitride layer on an oxide layer. The protective dielectric layer 13 provides scratch protection to the semiconductor device and protection against moisture and impurity contamination during subsequent processing. After deposition of protective dielectric layer 13, conventional photolithographic etching techniques are employed to form an opening to expose wire bonding layer 10 for external connection by means of bonding pad 14 and electrically conductive wires 15 or an external connection electrode (not shown).

Although only two conductive layers 8 and 10 are depicted in FIG. 1 for illustrative convenience, conventional semiconductor devices are not so limited and may comprise more than two conductive layers, depending on design requirements, e.g. five conductive metal layers. Also in the interest of illustrative convenience, FIG. 1 does not illustrate any particular type of plug or barrier layer technology. However, such technology is conventional and, therefore, the details of such features are not set forth herein.

As device features continually shrink in size, various circuit parameters become increasingly important. For example, the capacitance between gate electrode 4 and source/drain regions 3 is an important parameter that affects circuit operating speeds. Generally, when the transistor is under operating conditions, the voltage on gate electrode 4 changes according to the circuit conditions. This results in charging and discharging source/drain regions 3. Accordingly, any capacitance between gate electrode 4 and source/drain regions 3 slows the charging and discharging, and hence, slows the circuit operating speed.

In conventional semiconductor methodology illustrated in FIG. 2, after polysilicon gate electrode 4 is formed, ion implantation is conducted, as indicated by arrows 20, to form shallow source/drain (S/D) extensions 22. Subsequent to the formation of the S/D extensions 22, a layer of dielectric material, such as silicon dioxide or silicon nitride is deposited and etched to form insulating sidewall spacers 24 on the side surfaces of gate electrode 4, as shown in FIG. 3. Adverting to FIG. 3, ion implantation is then conducted, as indicated by arrows 30 to form moderately-doped source/drain (MDD) or heavily-doped source/drain (HDD) implants 32.

A drawback attendant upon the formation of conventional sidewall spacers 24 is that the material used to form the spacers typically has a relatively high dielectric constant (K), e.g., about 3.9 (oxide) to about 7.0 (nitride). These high-K materials increase the capacitance between gate electrode 4 and S/D extensions 22, thereby slowing circuit operating speeds. It is not practical to employ materials having a low-K to form sidewall spacers, since typical low-K materials are not robust enough to shield shallow S/D extensions 22 from the subsequent impurity implantations forming MDD/HDD regions 32. Further, typical low-K materials are not robust enough to prevent subsequent silicide formations from shorting the gate electrode to the source/drain areas. In high performance integrated circuits, such as those employed in microprocessors, capacitive loading must be reduced to as great an extent as possible to avoid reductions in circuit speed, without sacrificing circuit reliability.

SUMMARY OF THE INVENTION

There exists a need for a semiconductor device exhibiting reduced capacitance between the gate electrode and source/drain regions.

There is also a need for a method of manufacturing a semiconductor device having reduced capacitance between the gate electrode and source/drain regions.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to one aspect of the invention, a semiconductor device comprises a semiconductor substrate and a dielectric layer formed on the semiconductor substrate. The semiconductor device includes a gate electrode having an upper surface and side surfaces formed on the dielectric layer. The semiconductor device also includes a first spacer, comprising a first material having a low dielectric constant, formed on the side surfaces of the gate electrode.

Another aspect of the present invention provides a method for manufacturing a semiconductor device. The method includes forming a first dielectric layer on a surface of a semiconductor substrate and forming a conductive layer on the dielectric layer. The method also includes patterning the conductive layer to form a gate electrode having an upper surface and side surfaces. The method further includes forming a first spacer, comprising a material having a low dielectric constant, on the side surfaces of the gate electrode.

Other features and advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout.

DETAILED DESCRIPTION OF ILLUSTRATED EMBODIMENTS

The present invention addresses and solves the high capacitance problems associated with sidewall spacers having a high dielectric constant, thereby enabling the formation of transistors with increased operating speeds. As discussed previously, conventional semiconductor methodology employing sidewall spacers formed from a relatively high-K material, such as a silicon oxide or silicon nitride, results in an increased capacitance between the gate electrode and the source/drain regions. During circuit operations, the increased capacitance results in slower operating speeds.

The present invention solves the increased capacitance problem associated with conventional sidewall spacers by forming a sub-spacer from a material having a low dielectric constant (low-K). The sub-spacers are formed at the corners of the gate electrode above the source/drain regions, prior to forming conventional sidewall spacers. In accordance with an embodiment of the invention, a sub-spacer comprising a low-K material, e.g., a material having a K of about 1.5 to about 3.5, such as hydrogen silsesquioxane (HSQ), is formed at the corners of the gate electrode above the source/drain regions. Other suitable low-K materials for use in embodiments of the present invention to form sub-spacers include a spin-on glass (SOG) or other spin-on org-oxides.

Figure 1:
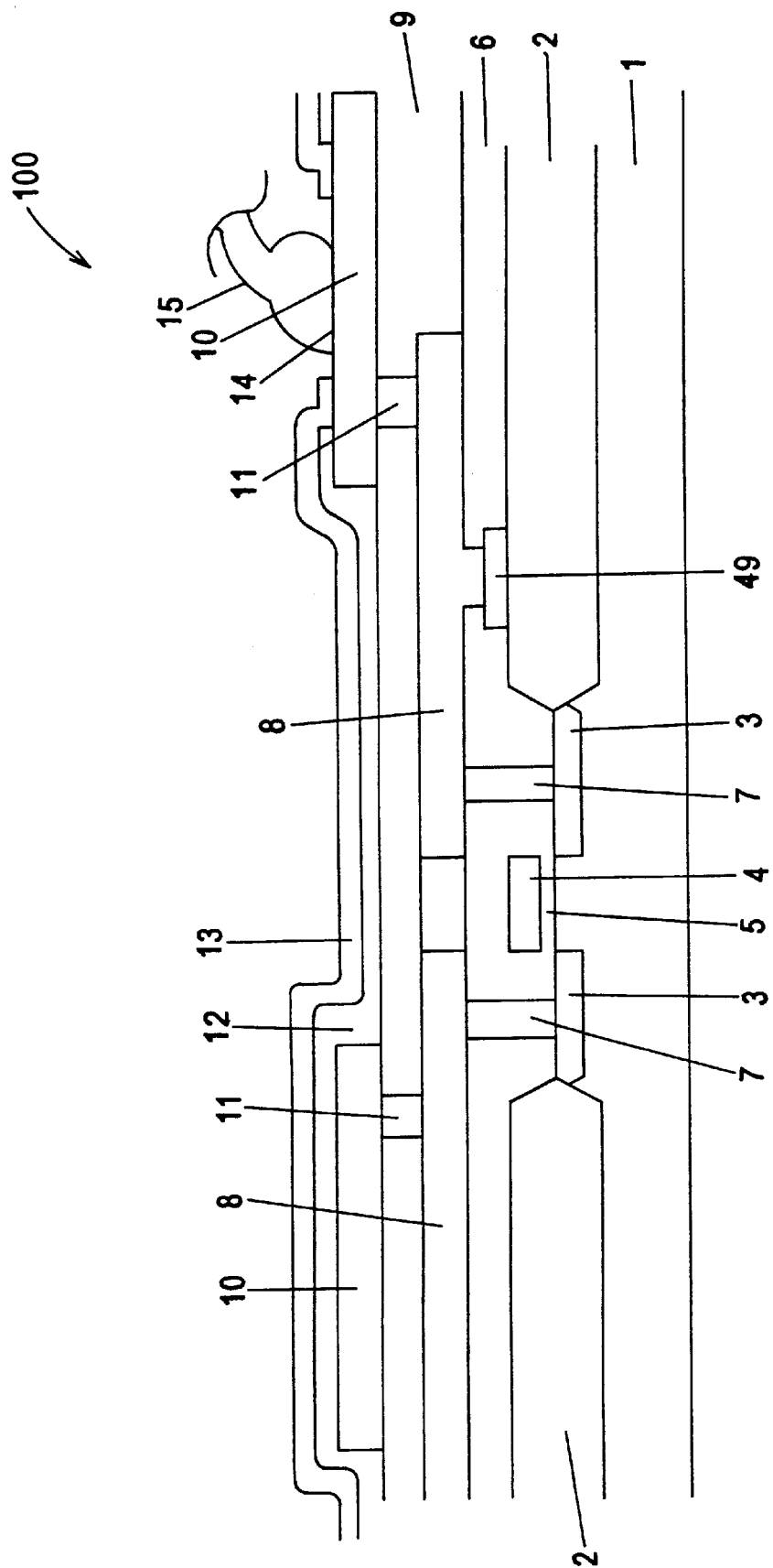
FIG. 1 schematically illustrates the cross-section of a conventional semiconductor device.
Figure 2:
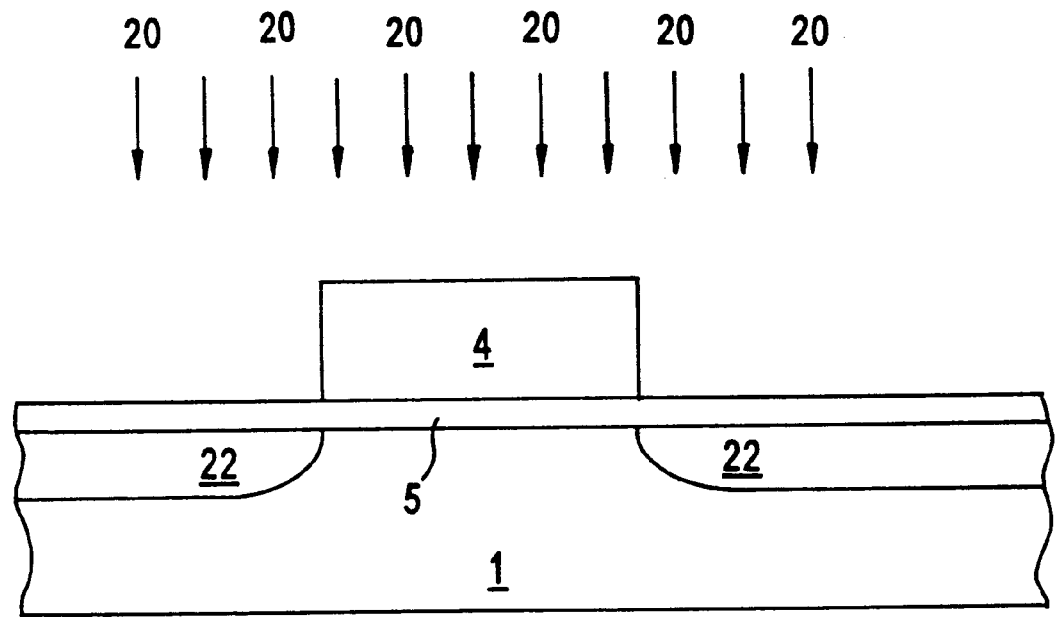
FIG. 2 illustrates the formation of shallow source/drain extensions according to conventional methodology.
Figure 3:
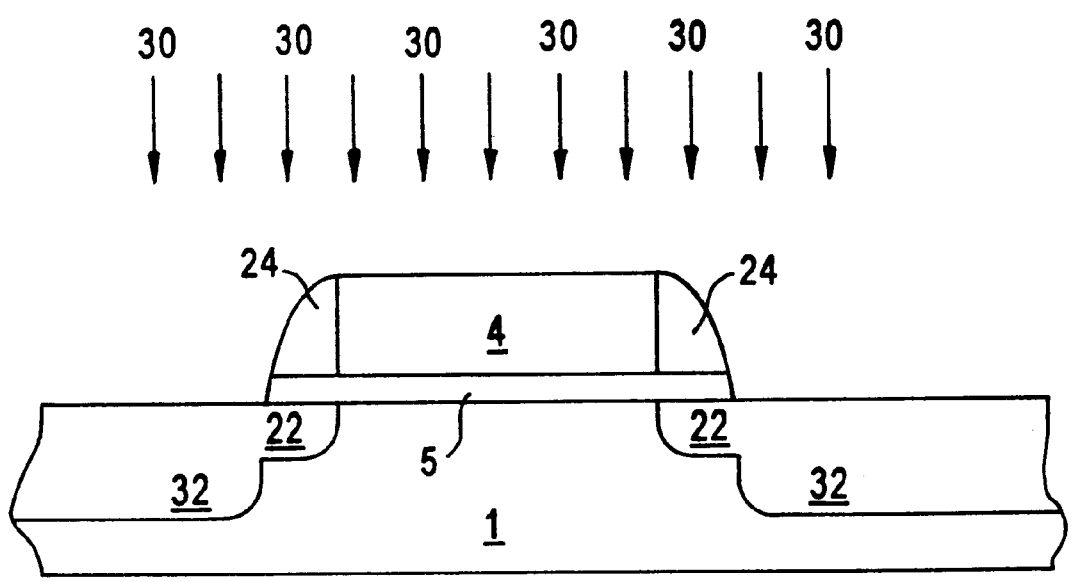
FIG. 3 illustrates the formation of sidewall spacers and MDD/HDD implant regions according to conventional methodology.
Figure 4:
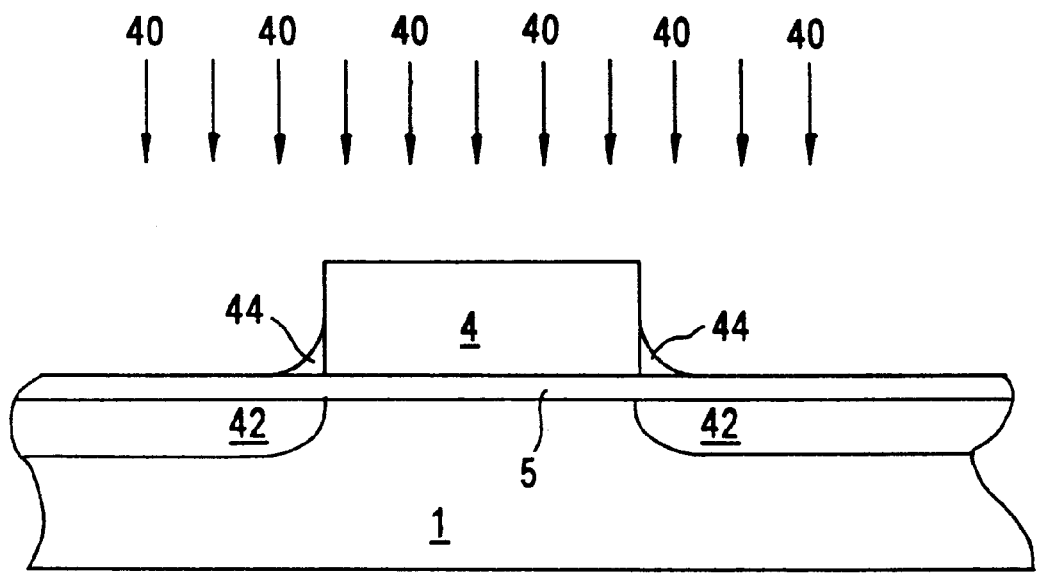
FIG. 4 illustrates the formation of source/drain extensions and sidewall sub-spacers according to an embodiment of the present invention.

An embodiment of the present invention is illustrated in FIG. 4, wherein an initial gate dielectric layer 5, such as silicon oxide, is formed on semiconductor substrate 1. A conductive layer, e.g., doped polycrystalline silicon, is deposited on gate oxide layer 5 and patterned in a conventional manner to form gate electrode 4.

Next, impurities are ion implanted to form shallow S/D extensions. Using gate electrode 4 as a mask, impurities are ion implanted, as indicated by arrows 40, at a relatively low energy to form shallow S/D extensions 42. In forming the shallow S/D extensions 42, N-type or P-type impurities are implanted, depending upon whether an N-channel MOSFET or a P-channel MOSFET is formed.

For example N-type impurities, such as arsenic, can be implanted at a dosage of about $1\times10^{14}$ atoms/cm$^2$ to about $2\times10^{15}$ atoms/cm$^2$ and an implantation energy of about 1 KeV to about 10 KeV to form the shallow implants of a N-channel MOSFET. Alternatively, P-type impurities, such as boron, can be implanted at a dosage of about $1\times10^{14}$ atoms/cm$^2$ to about $2\times10^{15}$ atoms/cm$^2$ and an implantation energy of about 0.5 KeV to about 2 KeV to form the shallow implants of a P-channel MOSFET.

The present invention departs from conventional technology by employing a low-K material, such as HSQ, thereby advantageously reducing the capacitance between gate electrode 4 and S/D extensions 42. Adverting to FIG. 4, HSQ is employed to form sub-spacers 44, as by spin-on techniques. Typically, in accordance with conventional spin-on techniques, a few drops of HSQ are strategically deposited on the semiconductor. After spinning the semiconductor, the HSQ collects in the desired corner locations to form sub-spacers 44. Given the guidance and objectives disclosed herein, the amount of HSQ deposited, as well as other application parameters, can be readily optimized in a particular situation to achieve maximum capacitance reduction between gate electrode 4 and S/D extensions 42, thereby optimizing circuit operating speeds.

For example, it has been found suitable to form sub-spacers 44 having a width of about 50Å to about 200Å. The height of sub-spacers 44 may also vary. For example, the height of sub-spacers 44 may extend vertically to the height of the gate electrode 4 or to any fraction of the height of the gate electrode 4. Additionally, the sub-spacers 44 depicted in FIG. 4 are concave in shape. However, in other embodiments, the sub-spacers 44 may be formed having other shapes, e.g., a convex shape.

In alternative embodiments, the low-K material employed to form sub-spacers 44 can be a spin-on glass (SOG) or another organo-oxide. The particular low-K material used depends on the particular circuit design requirements, in addition to various manufacturing concerns and material interaction issues. Generally, the low-K material is chosen to have a dielectric constant less than the dielectric constant of conventional sidewall spacers, e.g., less than about 3.9.

In another embodiment of the present invention, sub-spacers 44 are formed by depositing HSQ, e.g., by chemical vapor deposition (CVD), followed by anisotropically etching the HSQ to form the desired sub-spacers 44. Similar to the discussion above, alternative low-K materials, such as SOG or other organo-oxide material can be deposited and etched to form sub-spacers 44.

Figure 5:
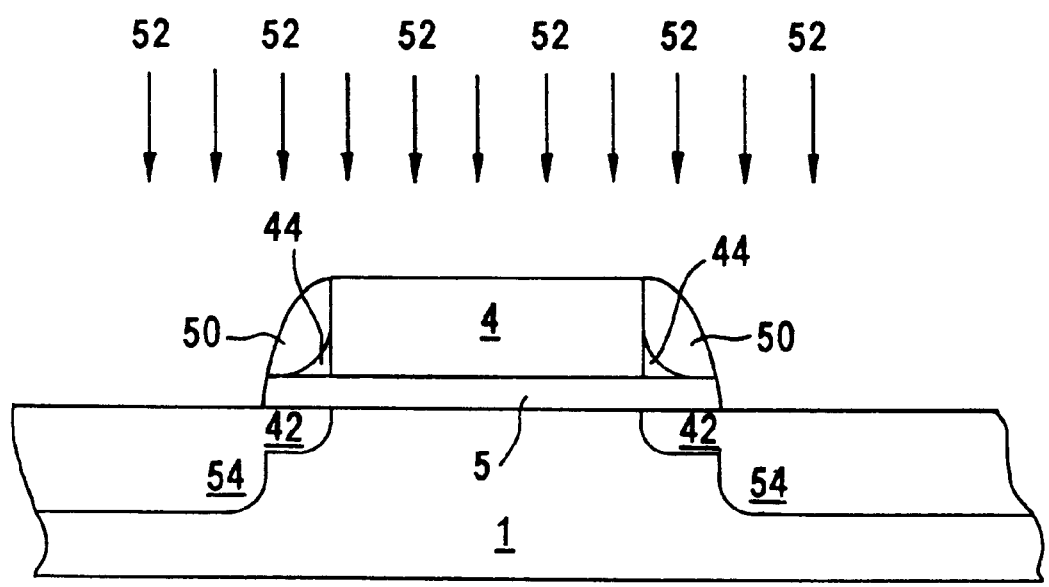
FIG. 5 illustrates the formation of sidewall spacers and MDD/HDD implant regions according to an embodiment of the present invention.

Adverting to FIG. 5, subsequent to the formation of sub-spacers 44, a layer of dielectric material, such as a silicon oxide, a silicon nitride or a silicon oxynitride, is deposited and etched to form insulating sidewall spacers 50 on top of sub-spacers 44 on the side surfaces of gate electrode 4. Ion implantation is then conducted, as indicated by arrows 52, to form moderately-doped source/drain (MDD) or heavily-doped source/drain (HDD) implants 54.

For example N-type impurities, such as arsenic, can be implanted at a dosage of about $1 \times 10^{15}$ atoms/cm$^2$ to about $6 \times 10^{15}$ atoms/cm$^2$ and an implantation energy of about 10 KeV to about 50 KeV to form the MDD/HDD implant regions 54 of an N-channel MOSFET. Alternatively, P-type impurities, such as boron, can be implanted at a dosage of about $1 \times 10^{15}$ atoms/cm$^2$ to about $6 \times 10^{15}$ atoms/cm$^2$ and an implantation energy of about 2 KeV to about 10 KeV to form the MDD/HDD implant regions 54 of a P-channel MOSFET. An activation anneal is then conducted to activate S/D extensions 42 and MDD/HDD regions 54. Annealing is typically performed at a temperature of about 900° C. to about 1100° C. to activate the impurity implanted regions, forming the source/drain regions.

The present invention advantageously reduces the capacitance between gate electrode 4 and source/drain regions, thereby enabling increased circuit speeds. In the exemplary embodiment, the capacitance between the activated source/drain regions and the gate electrode may be reduced to about 0.2 femtofarads/micron/side. Additionally, the present invention also strategically employs conventional sidewall spacers to ensure that the source/drain regions are formed at the desired locations to optimize transistor performance, notably to optimize channel length and junction depth.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail, in order not to unnecessarily obscure the present invention.

The dielectric and conductive layers utilized in manufacturing a semiconductor device in accordance with the present invention can be deposited by conventional deposition techniques. For example, metallization techniques such as various types of chemical vapor deposition (CVD) processes, including low pressure chemical vapor deposition (LPCVD), enhanced chemical vapor deposition (ECVD) and physical vapor deposition (PVD) can be employed.

The present invention enjoys applicability in the manufacturing of semiconductor devices and particularly in semiconductor devices comprising design features of 0.25 microns and under, with increased transistor and circuit speeds. The present invention is applicable to the formation of any of various types of semiconductor devices and, hence, details have not been set forth herein in order to avoid obscuring the thrust of the present invention. In practicing the present invention, conventional photolithographic and etching techniques are employed and, hence, the details of such techniques have not been set forth herein in detail.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising:

a semiconductor substrate;

a dielectric layer formed on the semiconductor substrate;

a gate electrode having an upper surface and side surfaces formed on the dielectric layer;

first sidewall spacers, comprising a first material having a low dielectric constant, formed on the side surfaces of the gate electrode;

a shallow source/drain region extending to a first depth below the surface of the semiconductor substrate; and a moderately or heavily doped source/drain region extending to a second depth greater than the first depths, wherein the first material has a dielectric constant of about 1.5 to about 3.5.

2. The semiconductor device of claim 1, comprising:

second sidewall spacers, comprising an insulating material, formed adjacent the side surfaces of the gate electrode and over the first sidewall spacers.

3. The semiconductor device of claim 2, wherein the first material comprises hydrogen silesquioxane.

4. The semiconductor device of claim 2, wherein the first material comprises a spin-on glass.

5. The semiconductor device of claim 2, wherein the first material comprises an organo-oxide.

6. The semiconductor device of claim 1, wherein the dielectric layer comprises a silicon oxide and the gate electrode comprises doped polysilicon.

* * * * *